(12) United States Patent
Unno

(10) Patent No.: US 11,483,901 B2
(45) Date of Patent: Oct. 25, 2022

(54) CERAMIC HEATER

(71) Applicant: NGK INSULATORS, LTD., Nagoya (JP)

(72) Inventor: Yutaka Unno, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 372 days.

(21) Appl. No.: 16/750,386

(22) Filed: Jan. 23, 2020

(65) Prior Publication Data
US 2020/0163165 A1    May 21, 2020

Related U.S. Application Data

(63) Continuation of application No. PCT/JP2019/026050, filed on Jul. 1, 2019.

(30) Foreign Application Priority Data

Jul. 13, 2018 (JP) ............................. JP2018-132826

(51) Int. Cl.
H05B 3/28 (2006.01)

(52) U.S. Cl.
CPC ..................................... H05B 3/283 (2013.01)

(58) Field of Classification Search
CPC . H05B 3/283; H05B 3/12; H05B 3/06; H05B 3/14; H05B 3/20; H01L 21/02; H01L 21/68792; H01L 21/67103; H01L 21/68785
See application file for complete search history.

(56) References Cited

U.S. PATENT DOCUMENTS

| 5,721,062 A | 2/1998 | Kobayashi |
| 6,028,022 A | 2/2000 | Ohashi |
| 6,447,626 B1 | 9/2002 | Ohashi |
| 7,854,975 B2 | 12/2010 | Fujii |

(Continued)

FOREIGN PATENT DOCUMENTS

| JP | 2783980 B2 | 8/1998 |
| JP | 2000-021957 A1 | 1/2000 |

(Continued)

OTHER PUBLICATIONS

International Search Report and Written Opinion (Application No. PCT/JP2019/026050) dated Jul. 30, 2019.

(Continued)

*Primary Examiner* — Shawntina T Fuqua
(74) *Attorney, Agent, or Firm* — Burr & Brown, PLLC

(57) ABSTRACT

A ceramic heater includes a ceramic plate having a wafer mounting surface and having a resistive heating element embedded in the plate; and a ceramic tubular shaft having a tubular shape and bonded to a back surface of the plate. The plate has a circular recess with a bottom in the back surface thereof. The tubular shaft has a plate-side flange extending radially outward from an outer peripheral surface of a plate-side end portion. An entire end surface of the plate-side end portion of the tubular shaft is bonded to a bonding region of the back surface of the plate outside the circular recess. The opening diameter d1 of the plate-side end portion of the tubular shaft, the inner diameter d2 of the plate-side flange of the tubular shaft, and the diameter D1 of the circular recess of the plate satisfy $d2 \geq d1 \geq D1$.

7 Claims, 8 Drawing Sheets

(56) References Cited

U.S. PATENT DOCUMENTS

| | | |
|---|---|---|
| 2007/0221648 A1 | 9/2007 | Unno et al. |
| 2012/0211933 A1* | 8/2012 | Goto ................ H01L 21/68757 269/293 |
| 2014/0231019 A1 | 8/2014 | Kajihara |
| 2020/0075361 A1* | 3/2020 | Unno ................ H01J 37/32724 |

FOREIGN PATENT DOCUMENTS

| | | |
|---|---|---|
| JP | 3316167 B2 | 8/2002 |
| JP | 2003-224044 A1 | 8/2003 |
| JP | 2004-128232 A1 | 4/2004 |
| JP | 2005-056759 A1 | 3/2005 |
| JP | 20050-056759 * | 3/2005 |
| JP | 4070752 B2 | 4/2008 |
| JP | 2010-040422 A1 | 2/2010 |
| JP | 5008875 B2 | 8/2012 |
| JP | 2017-183609 A1 | 10/2017 |
| JP | 2017-191910 * | 10/2017 |
| JP | 2017-191910 A1 | 10/2017 |
| KR | 10-2007-0096892 A | 10/2007 |
| KR | 10-2014-0065016 A | 5/2014 |

OTHER PUBLICATIONS

Korean Office Action (Application No. 10-2020-7002901) dated Nov. 24, 2021 (with English translation).
Korean Office Action (Application No. 10-2020-7002901) dated May 26, 2021 (with English translation).
English translation of the International Preliminary Report on Patentability (Chapter I) (Application No. PCT/JP2019/026050) dated Jan. 28, 2021.

\* cited by examiner

CERAMIC HEATER

BACKGROUND OF THE INVENTION

1. Field of the Invention

The present invention relates to ceramic heaters.

2. Description of the Related Art

There are conventionally known ceramic heaters that include a ceramic plate having a wafer mounting surface for mounting of a wafer and having a resistive heating element embedded in the plate and a ceramic tubular shaft bonded to the surface (back surface) opposite the wafer mounting surface of the plate (see, for example, PTL 1). If such ceramic heaters employ a solid shaft having no hole therein (e.g., a solid cylindrical shaft), a through-hole for insertion of power supply members for supplying electric power to the resistive heating element needs to be provided in the solid shaft before the power supply members are disposed therein. No such through-hole needs to be provided if a tubular shaft is employed. In addition, a solid shaft tends to cause the central portion of the plate to cool excessively by dissipating an excessive amount of heat and is also more likely to be damaged when a stress is applied thereto because of its excessive stiffness. These can be alleviated if a tubular shaft is employed. The plate and the tubular shaft are joined together, for example, by solid-phase bonding. In this case, a flange is provided radially outward from the end portion of the tubular shaft. In solid-phase bonding, the back surface of the plate and the flange surface of the tubular shaft are bonded together by lapping or otherwise machining the individual surfaces to reduce the surface roughness Ra, applying a bonding aid solution to the individual surfaces, and pressing and heating the individual surfaces in contact with each other.

CITATION LIST

Patent Literature

PTL 1: JP 2010-40422 A

SUMMARY OF THE INVENTION

However, it is inefficient to reduce the surface roughness by lapping or otherwise machining the entire back surface of the plate. In addition, it is necessary to ensure that no crack occurs in the flange of the tubular shaft during solid-phase bonding since the bonding is performed by heating while a load is being applied to the flange toward the plate. Furthermore, it is also necessary to inhibit cracking of the flange due to repeated temperature rises and drops during the use of the ceramic heater.

The present invention has been made to solve the foregoing problems. A primary object of the present invention is to provide a ceramic heater that is less susceptible to damage such as cracking.

A ceramic heater according to the present invention includes a ceramic plate having a wafer mounting surface for mounting of a wafer and having a resistive heating element embedded in the plate; and a ceramic tubular shaft bonded to a back surface opposite the wafer mounting surface of the plate, wherein the plate has a circular recess with a bottom in the back surface thereof, the tubular shaft has a plate-side flange extending radially outward from an outer peripheral surface of a plate-side end portion, an entire end surface of the plate-side end portion of the tubular shaft is bonded to a bonding region of the back surface of the plate outside the circular recess, and the opening diameter $d_1$ of the plate-side end portion of the tubular shaft, the inner diameter $d_2$ of the plate-side flange of the tubular shaft, and the diameter $D_1$ of the circular recess of the plate satisfy $d_2 \geq d_1 \geq D_1$.

This ceramic heater has the bonding region outside the circular recess provided in the back surface of the plate. Thus, even if the bonding region needs to be subjected to surface machining, the bottom surface of the circular recess need not be subjected to surface machining, which reduces the workload as compared to the surface machining of the entire back surface of the plate. In addition, the opening diameter $d_1$ of the plate-side end portion of the tubular shaft, the inner diameter $d_2$ of the plate-side flange of the tubular shaft, and the diameter $D_1$ of the circular recess of the plate satisfy $d_2 \geq d_1 \geq D_1$. Even if the plate and the tubular shaft are bonded together by heating while a load is being applied to the plate-side flange of the tubular shaft toward the plate, a crack is less likely to occur in the plate-side flange because the entire end surface the plate-side end portion of the tubular shaft is in contact with the bonding region outside the circular recess. A crack is also less likely to occur in the plate-side flange after repeated temperature rises and drops during the use of the ceramic heater.

The plate of the ceramic heater according to the present invention may have a doughnut-shaped protrusion on the back surface thereof. The circular recess may be a region inside the protrusion. The bonding region may be a portion of a surface of the protrusion or the entire surface of the protrusion. In this case, even if the bonding region needs to be subjected to surface machining, the bonding region is a portion of the surface of the doughnut-shaped protrusion or the entire surface of the doughnut-shaped protrusion, which requires less area to be subjected to surface machining. A smooth surface condition that is more suitable for bonding can be achieved.

Here, stress due to repeated temperature rises and drops in the ceramic heater concentrates at a rising portion of the outer peripheral wall of the doughnut-shaped protrusion. Thus, if the bonded surfaces of the plate and the tubular shaft are close to the rising portion, a crack might occur near the bonded surfaces. Accordingly, it is preferred that the height of the outer peripheral wall of the protrusion be higher than the height of the inner peripheral wall of the protrusion so that the bonded surfaces of the plate and the tubular shaft are separated from the rising portion of the outer peripheral wall of the protrusion, thereby preventing cracking near the bonded surfaces. For example, the height of the outer peripheral wall of the protrusion may be from 1.5 mm to 3 mm.

The circular recess of the ceramic heater according to the present invention preferably has a depth of from 0.1 mm to 0.5 mm. When the bonding region outside the circular recess is subjected to surface machining, the depth of cut is several micrometers to several tens of micrometers; therefore, it is sufficient for the circular recess to have a depth of 0.1 mm or more. If the circular recess has a depth of 0.5 mm or less, the time required to form the circular recess in the back surface of the plate can be shortened, and the sidewall of the circular recess does not have an excessive surface area and thus does not dissipate an excessive amount of heat.

An opening edge of the plate-side end portion of the tubular shaft of the ceramic heater according to the present invention may be chamfered. In this case, the opening diameter d1 of the plate-side end portion of the tubular shaft can be adjusted by chamfering, which allows the above relational expression to be relatively easily satisfied.

DETAILED DESCRIPTION OF THE INVENTION

Figure 1:
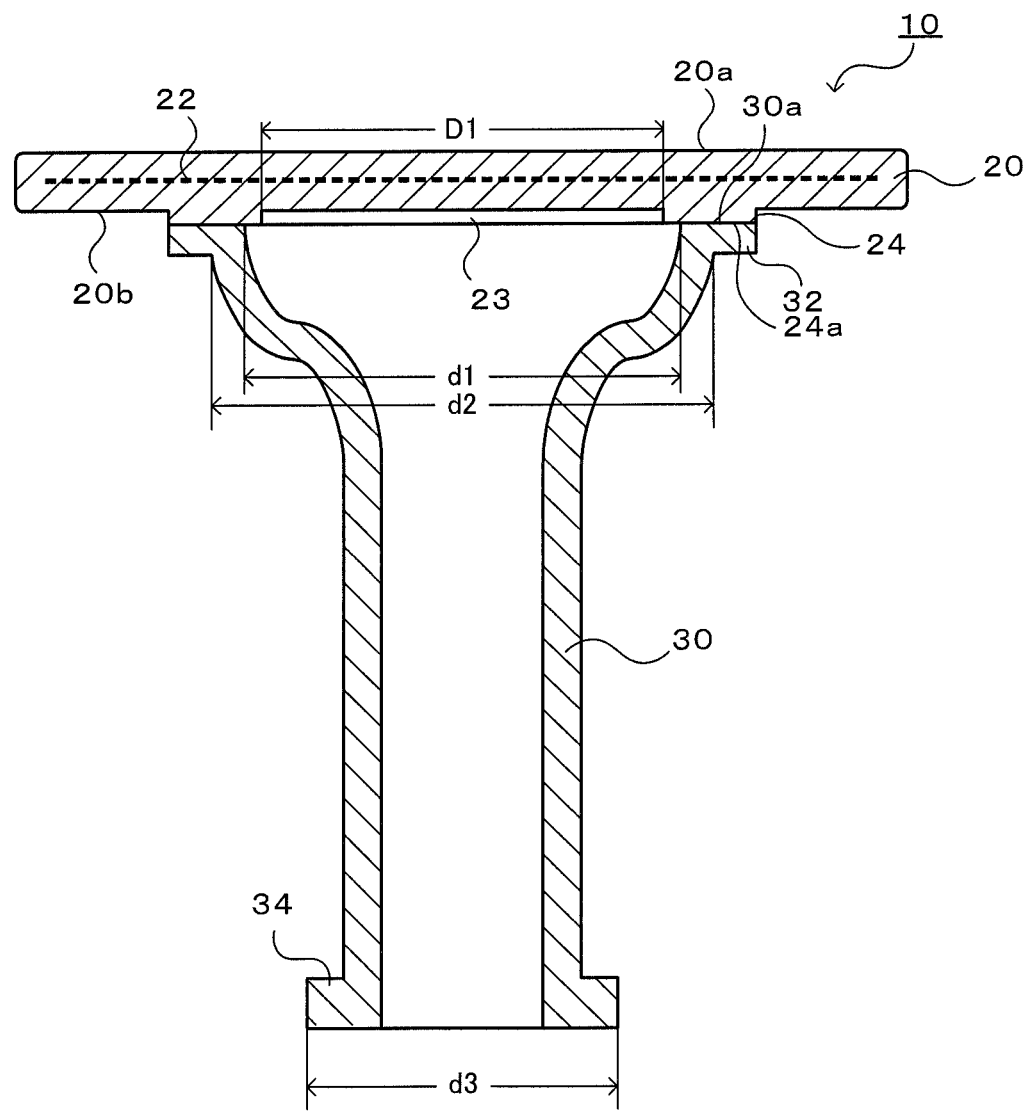
FIG. 1 is a longitudinal sectional view of a ceramic heater 10 according to one embodiment.
Figure 2:
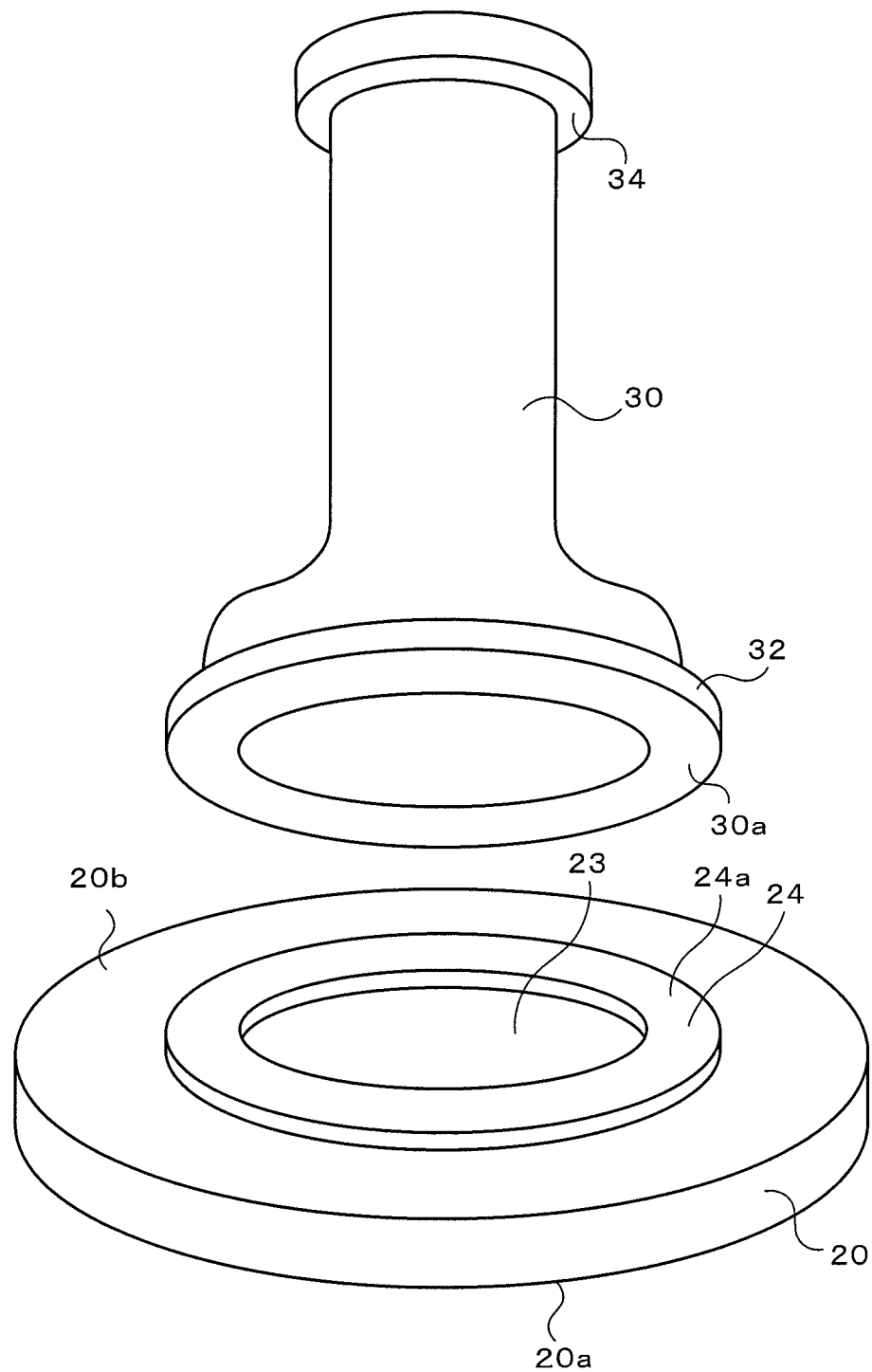
FIG. 2 is a perspective view showing how a bonding surface of a tubular shaft 30 is placed on a bonding surface of a plate 20.
Figure 3:
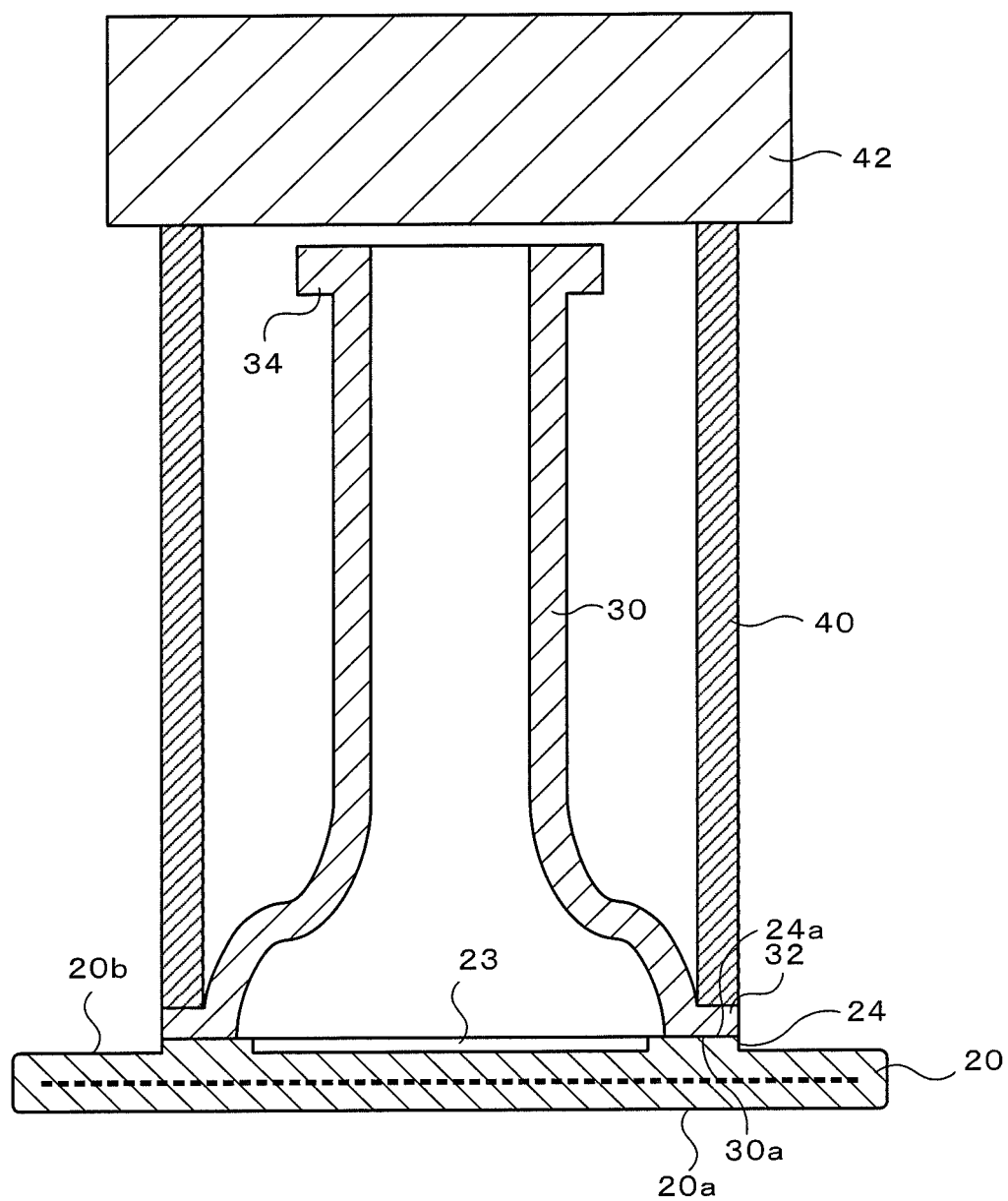
FIG. 3 illustrates a step of bonding the plate 20 and the tubular shaft 30 together.

A preferred embodiment of the present invention will hereinafter be described with reference to the drawings. FIG. 1 is a longitudinal sectional view of a ceramic heater 10 (a sectional view taken in a plane containing the central axis of the ceramic heater 10). FIG. 2 is a perspective view showing how a bonding surface of a tubular shaft 30 is placed on a bonding surface of a plate 20. FIG. 3 illustrates a step of bonding the plate 20 and the tubular shaft 30 together.

The ceramic heater 10 is used to heat a wafer to be subjected to processes such as etching and CVD and is installed in a vacuum chamber (not shown). This ceramic heater 10 includes a plate 20 on which a wafer can be mounted and a tubular shaft 30 supporting the plate 20.

The plate 20 is a ceramic circular plate having a resistive heating element 22 built thereinto. The plate 20 has a front surface serving as a wafer mounting surface 20a for mounting of a wafer. The plate 20 has a flat doughnut-shaped protrusion 24 on a back surface 20b opposite the wafer mounting surface 20a. The plate 20 has a circular recess 23 with a bottom in the region of the back surface 20b inside the doughnut-shaped protrusion 24. The bottom surface of the circular recess 23 and the region of the back surface 20b of the plate 20 outside the protrusion 24 may have the same or different heights. Examples of ceramics include, but not limited to, ceramics made from aluminum nitride, alumina, silicon carbide, silicon nitride, and the like. The resistive heating element 22 is coil-shaped, ribbon-shaped, mesh-shaped, plate-shaped, or film-shaped and is formed from a material containing, as a main component, W, Mo, Ti, Si, or Ni, in either elemental or compound (e.g., carbide) form, a combination thereof, or a mixture thereof with the ceramic material used for the plate 20. The resistive heating element 22 is routed throughout the entire wafer mounting surface 20a in the form of one line drawn from one end to the other end. The two ends of the resistive heating element 22 are connected to power supply terminals (not shown) exposed on the back surface 20b of the plate 20 in the inner space of the tubular shaft 30. The pair of power supply terminals are connected to an external power supply (not shown) through bar-shaped power supply members (not shown) connected to the individual power supply terminals. The bar-shaped power supply members are disposed in the inner space of the tubular shaft 30. The resistive heating element 22 generates heat when supplied with electric power from the external power supply, thereby heating a wafer mounted on the wafer mounting surface 20a.

The tubular shaft 30 is a ceramic tubular member and is bonded to the back surface 20b of the plate 20. The tubular shaft 30 has a plate-side flange 32 extending radially outward from the outer peripheral surface of a plate-side end portion and an opposite-side flange 34 extending radially outward from the outer peripheral surface of an end portion opposite the plate-side end portion. The entire end surface 30a of the plate-side end portion of the tubular shaft 30 is bonded to a flat surface portion 24a of the protrusion 24 of the plate 20 (a bonding region outside the circular recess 23). The opening diameter d1 of the plate-side end portion of the tubular shaft 30, the inner diameter d2 of the plate-side flange 32, and the diameter D1 of the circular recess 23 of the plate 20 satisfy d2≥d1≥D1. The tubular shaft 30 has a shape that is widened radially outward near the plate-side end portion. The outer diameter d3 of the opposite-side flange 34 is smaller than the inner diameter d2 of the plate-side flange 32 (d3<d2). The outer diameter of the plate-side flange 32 is equal to the outer diameter of the doughnut-shaped protrusion 24. Alternatively, the outer diameter of the plate-side flange 32 may be smaller than the outer diameter of the doughnut-shaped protrusion 24.

Next, a method for bonding the plate 20 and the tubular shaft 30 together will be described with reference to FIGS. 2 and 3. Here, an example in which the plate 20 and the tubular shaft 30 are subjected to solid-phase bonding will be described. Solid-phase bonding is discussed in detail in, for example, Japanese Patent Nos. 2783980, 4070752, and 3316167.

First, the flat surface portion 24a of the doughnut-shaped protrusion 24 of the plate 20 and the end surface 30a of the plate-side end portion of the tubular shaft 30 are lapped to a predetermined surface roughness Ra (e.g., 0.4 µm or less). Optionally, a bonding aid solution (e.g., an aqueous yttrium nitrate solution) is then applied to one or both of the flat surface portion 24a and the end surface 30a.

The plate 20 is then placed on a work table (not shown), with the protrusion 24 facing upward. The flat surface portion 24a of the plate 20 and the end surface 30a of the tubular shaft 30 are placed on top of each other. This placement is performed such that the entire end surface 30a of the tubular shaft 30 comes into contact with the flat surface portion 24a of the plate 20. In addition, this placement is performed such that the central axis of the plate 20 is aligned with the central axis of the tubular shaft 30.

A pressing tube 40 is then set from the end portion opposite the plate-side end portion of the tubular shaft 30. This results in a state in which the lower end surface of the pressing tube 40 is in contact with the back surface of the plate-side flange 32. The inner diameter of the pressing tube 40 is substantially equal to the inner diameter d2 of the plate-side flange 32 and is larger than the outer diameter d3 of the opposite-side flange 34. The outer diameter of the pressing tube 40 is substantially equal to the outer diameter of the plate-side flange 32. Thus, the pressing tube 40 can be easily set on the tubular shaft 30. The height of the pressing tube 40 is higher than that of the tubular shaft 30.

A weight 42 is then placed on the upper end surface of the pressing tube 40. This is set in a heating furnace and, in an inert gas atmosphere, is heated to a predetermined high temperature (e.g., 1,800° C. to 2,000° C.), is held at that temperature for a predetermined period of time, and is cooled. The pressing force applied by the weight 42 to the two bonding surfaces (the flat surface portion 24a and the end surface 30a) in a heated state causes the ceramics forming the plate 20 and the tubular shaft 30 to undergo solid-phase bonding. In this way, even if the bonding is performed by heating while a load is being applied to the plate-side flange 32 of the tubular shaft 30, a crack is less likely to occur in the plate-side flange 32 because the entire end surface 30a of the tubular shaft 30 is in contact with the bonding region outside the circular recess 23 (i.e., the flat surface portion 24a of the protrusion 24). A crack is also less likely to occur in the plate-side flange 32 after repeated temperature rises and drops during the use of the ceramic heater 10.

Figure 4:
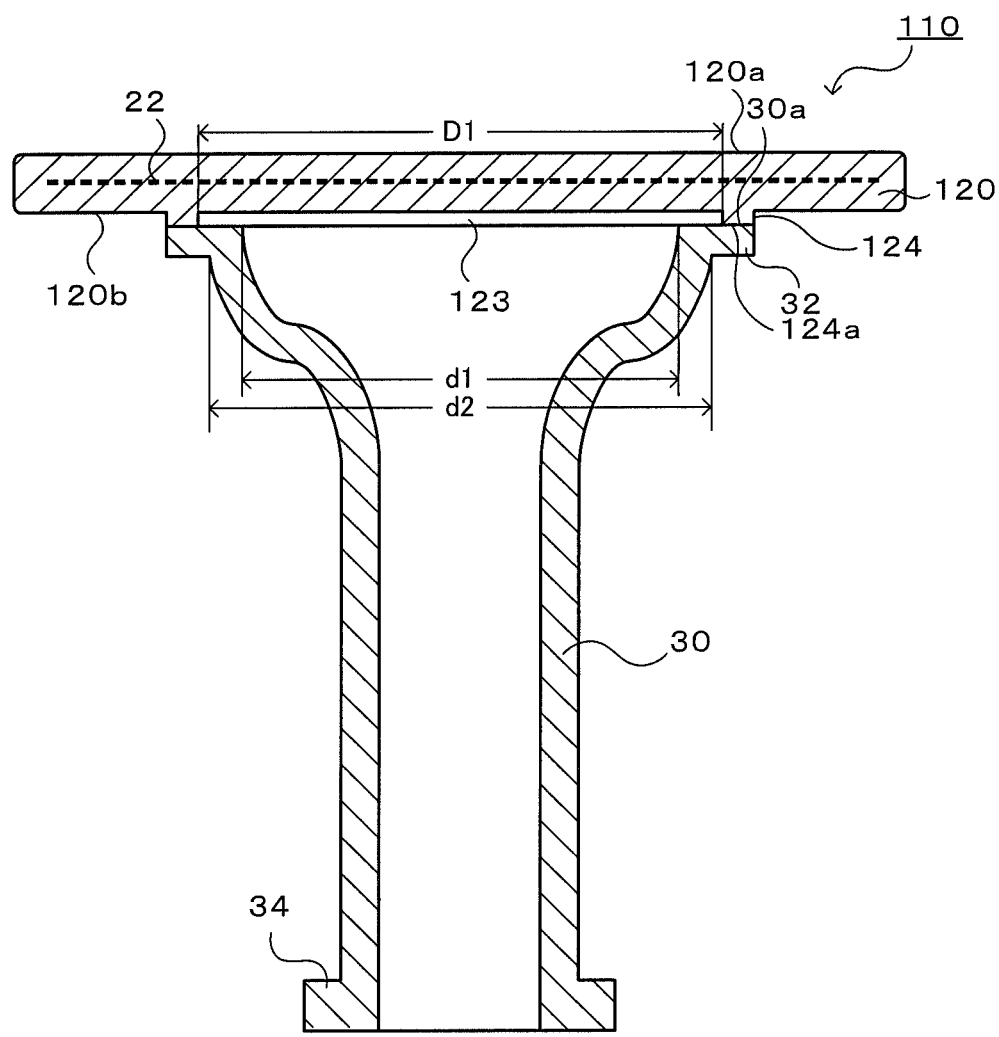
FIG. 4 is a longitudinal sectional view of a comparative ceramic heater 110.
Figure 5:
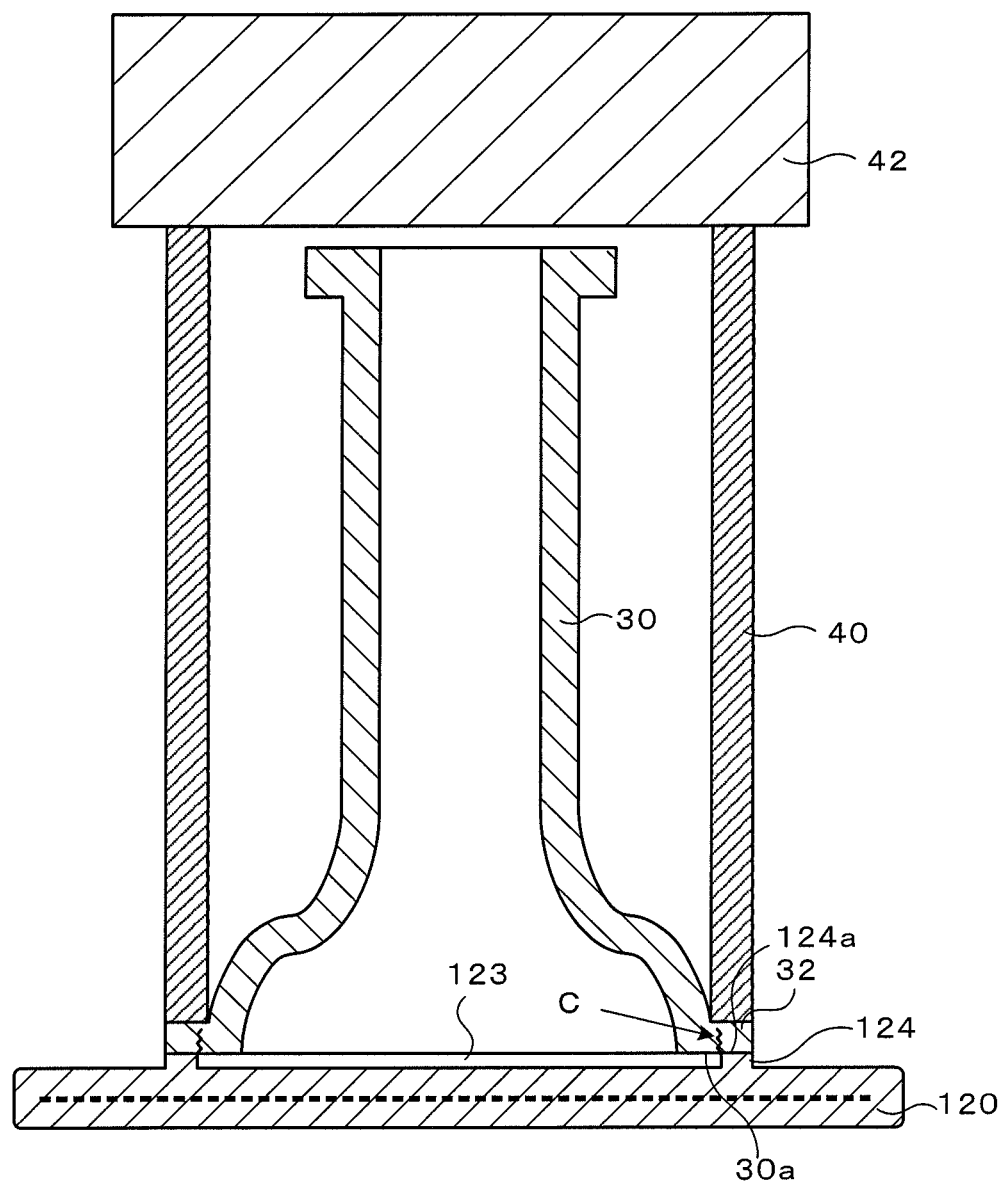
FIG. 5 illustrates a step of bonding a plate 120 and the tubular shaft 30 together.

On the other hand, FIG. 4 is a longitudinal sectional view of a comparative ceramic heater 110. A plate 120 of the ceramic heater 110 has a front surface serving as a wafer mounting surface 120a and a back surface 120b with a doughnut-shaped flat protrusion 124. The outer diameter of the plate-side flange 32 of the tubular shaft 30 is equal to the outer diameter of the protrusion 124. The inner diameter D1 of the region inside the protrusion 124 (i.e., a circular recess 123) is larger than the opening diameter d1 of the plate-side end portion of the tubular shaft 30 and is larger than the inner diameter d2 of the plate-side flange 32. That is, D1>d1, and D1>d2; therefore, d2≥d1≥D1 is not satisfied. The end surface 30a of the tubular shaft 30 extends beyond the flat surface portion 124a of the protrusion 124. In FIG. 4, the same elements as in the foregoing embodiment are denoted by the same reference numerals. The comparative ceramic heater 110 is also manufactured by bonding the plate 120 and the tubular shaft 30 together. If the pressing tube 40 and the weight 42 are used to performed solid-phase bonding as in the foregoing embodiment, the load applied to the plate-side flange 32 of the tubular shaft 30 toward the plate 120 in a heated state causes the inner side of the end surface 30a of the tubular shaft 30 to be pressed into the circular recess 123, with the result that, as shown in FIG. 5, a crack C occurs in the portion of the end surface 30a in contact with the edge of the circular recess 123. Even if no crack has occurred during bonding, a crack C due to a thermal history occurs after repeated temperature rises and drops during the use of the ceramic heater 110.

The ceramic heater 10 described above has the bonding region on the portion of the plate 20 outside the circular recess 23. Thus, even if the bonding region needs to be subjected to surface machining or other process, the bottom surface of the circular recess 23 need not be subjected to surface machining, which reduces the workload as compared to the surface machining of the entire back surface 20b of the plate 20. In addition, the opening diameter d1 of the plate-side end portion of the tubular shaft 30, the inner diameter d2 of the plate-side flange 32, and the diameter D1 of the circular recess 23 of the plate 20 satisfy d2≥d1≥D1. Even if the plate 20 and the tubular shaft 30 are bonded together by heating while a load is being applied to the plate-side flange 32 of the tubular shaft 30 toward the plate 20, a crack is less likely to occur in the plate-side flange 32 because the entire end surface 30a of the tubular shaft 30 is in contact with the bonding region outside the circular recess 23. A crack is also less likely to occur in the plate-side flange 32 after repeated temperature rises and drops during the use of the ceramic heater 10.

In addition, the plate 20 has the doughnut-shaped protrusion 24 on the back surface 20b thereof. The circular recess 23 is a region inside the protrusion 24. The bonding region is a portion of the flat surface portion 24a of the protrusion 24. Thus, if the bonding region needs to be subjected to surface machining, the flat surface portion 24a may be subjected to surface machining, which requires less area to be machined.

The circular recess 23 preferably has a depth of from 0.1 mm to 0.5 mm. When the bonding region outside the circular recess 23 is subjected to surface machining, the depth of cut is several micrometers to several tens of micrometers; therefore, it is sufficient for the circular recess 23 to have a depth of 0.1 mm or more. If the circular recess 23 has a depth of 0.5 mm or less, the time required to form the circular recess 23 in the back surface 20b of the plate 20 can be shortened, and the sidewall of the circular recess 23 does not have an excessive surface area and thus does not dissipate an excessive amount of heat.

It should be understood that the present invention is not limited to the foregoing embodiment in any way, but can be practiced in various embodiments within the technical scope of the invention.

For example, although an example in which the plate 20 and the tubular shaft 30 are subjected to solid-phase bonding has been described in the foregoing embodiment, they may be bonded together by methods other than solid-phase bonding. For example, thermal compression bonding (TCB) may be employed. TCB is discussed in detail in, for example, Japanese Patent No. 5008875. TCB uses a soft metal as a bonding material. Examples of soft metals include aluminum and aluminum alloys. Aluminum alloys preferably contain 0.5% to 5% by weight of magnesium (Mg). The bonding temperature is set below the liquidus of the soft metal. In addition, the bonding temperature is preferably set to the solidus of the soft metal minus 30° C. (solidus −30° C.) or higher. Furthermore, the pressure during the thermal pressure bonding of the plate 20 and the tubular shaft 30 is preferably set to 4.9 to 19.8 MPa. If TCB is employed, the same advantages as in the foregoing embodiment can be provided.

In the foregoing embodiment, the inner diameter of the doughnut-shaped protrusion 24 (i.e., the inner diameter D1 of the circular recess 23) may be equal to the opening diameter d1 of the plate-side end portion of the tubular shaft 30. In this case, the same advantages as in the foregoing embodiment can be provided.

Figure 6:
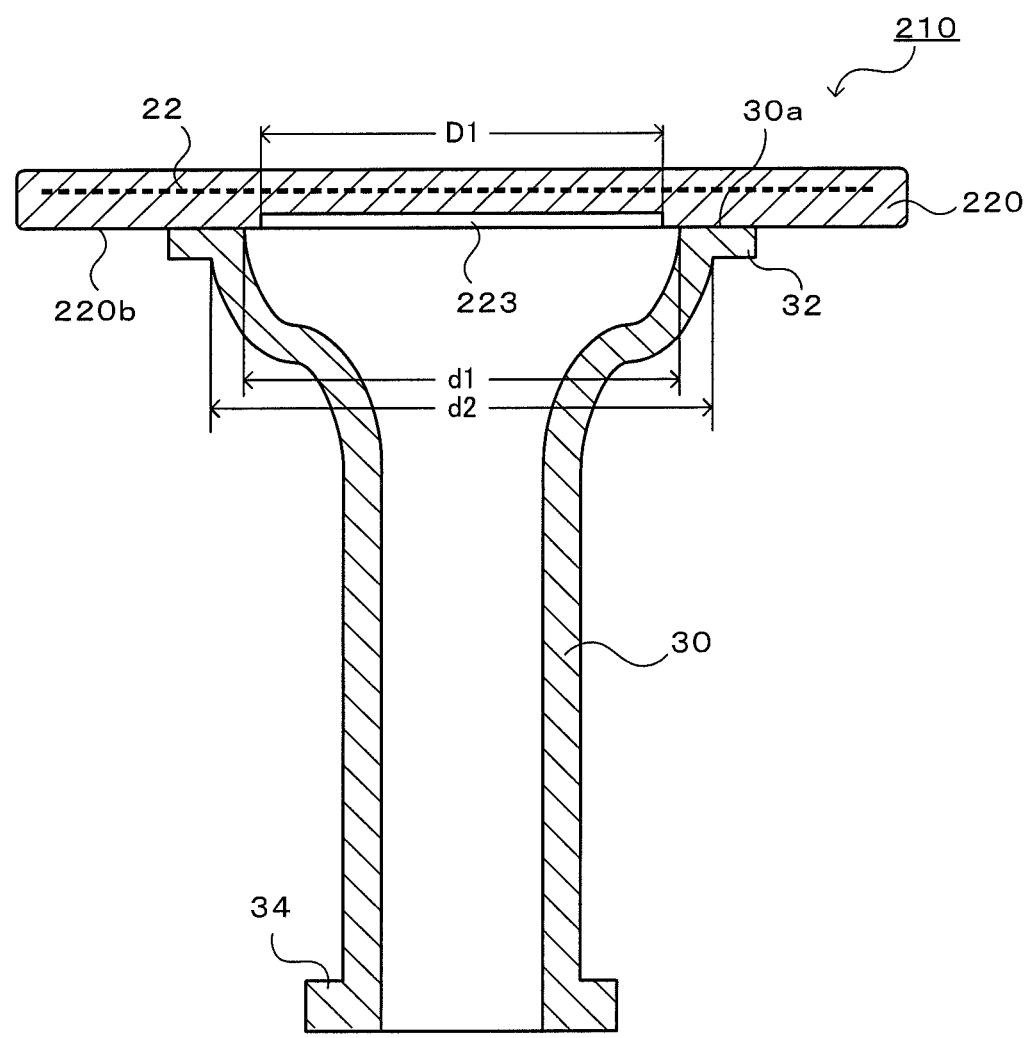
FIG. 6 is a longitudinal sectional view of a ceramic heater 210 according to another embodiment.

In the foregoing embodiment, the doughnut-shaped protrusion 24 is provided on the back surface 20b of the plate 20 to define the circular recess 23 in the region inside the protrusion 24; as in the case of a ceramic heater 210 shown in FIG. 6, the protrusion 24 may be omitted, and a circular recess 223 that is concentric with a plate 220 may be provided in a back surface 220b of the plate 220. In FIG. 6, the same elements as in the foregoing embodiment are denoted by the same reference numerals. The ceramic heater 210 can provide the same advantages as in the foregoing embodiment if d2≥d1≥D1 is satisfied.

Figure 7:
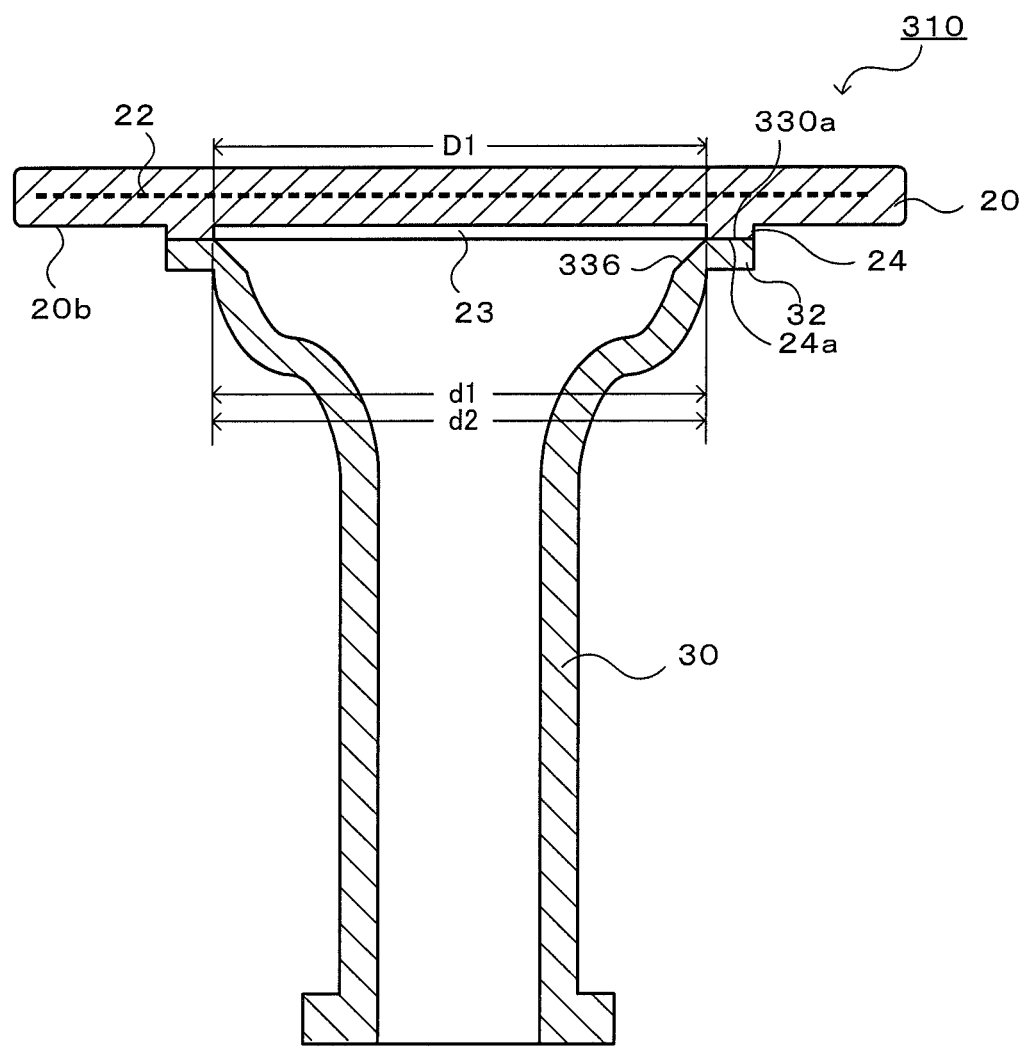
FIG. 7 is a longitudinal sectional view of a ceramic heater 310 according to another embodiment.

In the foregoing embodiment, the opening edge of the plate-side end portion of the tubular shaft 30 is not chamfered; as in the case of a ceramic heater 310 shown in FIG. 7, the opening edge of the plate-side end portion of the tubular shaft 30 may be C-chamfered to form a tapered portion 336. In FIG. 7, the opening diameter d1 of the plate-side end portion of the tubular shaft 30 and therefore the area of the end surface 330a of the plate-side end portion are smaller than those of the foregoing embodiment because of C-chamfering. In FIG. 7, the same elements as in the foregoing embodiment are denoted by the same reference numerals. The ceramic heater 310 can provide the same advantages as in the foregoing embodiment if d2≥d1≥D1 is satisfied (in FIG. 7, d2=d1=D1). Instead of C-chamfering, the opening edge may be R-chamfered. In FIG. 7, the doughnut-shaped protrusion 24 may be omitted, and the circular recess 223 with a bottom shown in FIG. 6 may be provided.

Although the foregoing embodiment shows an example in which the plate 20 has the resistive heating element 22 built thereinto, the plate 20 may have an electrostatic electrode or a radio-frequency electrode built thereinto in addition to the resistive heating element 22. The electrostatic electrode is used to attract a wafer onto the wafer mounting surface 20a, whereas the radio-frequency electrode is used to generate plasma.

Figure 8:
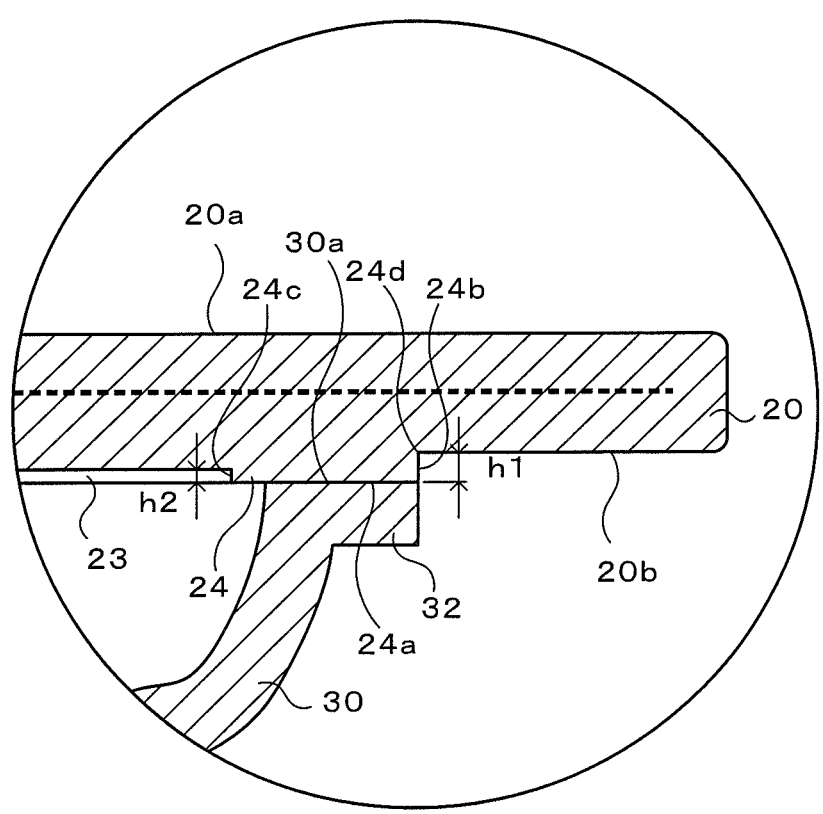
FIG. 8 is a partial enlarged sectional view of a modification of the ceramic heater 10.

In the foregoing embodiment, as shown in FIG. 8, the height h1 of an outer peripheral wall 24b of the doughnut-shaped protrusion 24 (the height from the flat surface portion 24a to the region of the back surface 20b of the plate 20 outside the protrusion 24) may be higher than the height h2 of an inner peripheral wall 24c of the protrusion 24 (the height from the flat surface portion 24a to the region of the back surface 20b of the plate 20 inside the protrusion 24). The height h2 is equal to the depth of the circular recess 23. In FIG. 8, the same elements as in the foregoing embodiment are denoted by the same reference numerals. Stress due to repeated temperature rises and drops in the ceramic heater 10 concentrates at a rising portion 24d of the outer peripheral wall 24b of the protrusion 24. Thus, if the bonded surfaces of the plate 20 and the tubular shaft 30 are close to the rising portion 24d of the outer peripheral wall 24b of the protrusion 24, a crack might occur near the bonded surfaces. Accordingly, as shown in FIG. 8, it is preferred that the height h1 of the outer peripheral wall 24b of the protrusion 24 be higher than the height h2 of the inner peripheral wall 24c of the protrusion 24 so that the bonded surfaces of the plate 20 and the tubular shaft 30 are separated from the rising portion 24d of the outer peripheral wall 24b of the protrusion 24, thereby preventing cracking near the bonded surfaces. The height h1 of the outer peripheral wall 24b of the protrusion 24 is preferably from 1.5 mm to 3 mm. The height h2 of the inner peripheral wall 24c of the protrusion 24, as described above, is preferably from 0.1 mm to 0.5 mm. The rising portion 24d is preferably C-chamfered or R-chamfered to alleviate stress concentration.

The present application claims priority from Japanese Patent Application No. 2018-132826 filed on Jul. 13, 2018, the entire contents of which are incorporated herein by reference.

What is claimed is:

1. A ceramic heater comprising a ceramic plate having a wafer mounting surface for mounting of a wafer and having a resistive heating element embedded in the plate; and a ceramic tubular shaft having a tubular shape and bonded to a back surface of the plate,
    wherein the plate has a circular recess with a bottom in the back surface thereof,
    the tubular shaft has a plate-side flange extending radially outward from an outer peripheral surface of a plate-side end portion and an opposite-side flange extending radially outward from the outer peripheral surface of an end portion opposite the plate-side end portion,
    an entire end surface of the plate-side end portion of the tubular shaft is bonded to a bonding region of the back surface of the plate outside the circular recess,
    an opening diameter d1 of the plate-side end portion of the tubular shaft, an inner diameter d2 of the plate-side flange of the tubular shaft, and a diameter D1 of the circular recess of the plate satisfy d2≥d1≥D1, and
    an outer diameter d3 of the opposite-side flange and the inner diameter d2 of the plate-side flange satisfy d3<d2,
    wherein the tubular shaft has a widened portion that is widened radially outward near the plate-side end portion and an outer diameter of the widened portion is gradually wider radially upwardly toward the plate-side end portion of the tubular shaft.

2. The ceramic heater according to claim 1, wherein
    the plate has a doughnut-shaped protrusion on the back surface thereof,
    the circular recess is a region inside the protrusion, and
    the bonding region is a portion of a surface of the protrusion or the entire surface of the protrusion.

3. The ceramic heater according to claim 2, wherein a height of an outer peripheral wall of the protrusion is higher than a height of an inner peripheral wall of the protrusion.

4. The ceramic heater according to claim 1, wherein the circular recess has a depth of from 0.1 mm to 0.5 mm.

5. The ceramic heater according to claim 2, wherein the circular recess has a depth of from 0.1 mm to 0.5 mm.

6. The ceramic heater according to claim 1, wherein an opening edge of the plate-side end portion of the tubular shaft is chamfered.

7. The ceramic heater according to claim 2, wherein an opening edge of the plate-side end portion of the tubular shaft is chamfered.

* * * * *